United States Patent [19]

Yamaguchi et al.

[11] Patent Number: 5,355,012

[45] Date of Patent: Oct. 11, 1994

[54] SEMICONDUCTOR DEVICE

[75] Inventors: Yasuo Yamaguchi; Natsuo Ajika; Tsuyoshi Yamano, all of Hyogo, Japan

[73] Assignee: Mitsubishi Denki Kabushiki Kaisha, Tokyo, Japan

[21] Appl. No.: 52,858

[22] Filed: Apr. 28, 1993

Related U.S. Application Data

[63] Continuation of Ser. No. 767,333, Sep. 30, 1991.

[30] Foreign Application Priority Data

Oct. 3, 1990 [JP] Japan .................................. 2-267497

[51] Int. Cl.$^5$ ...................... H01L 29/78; H01L 33/00
[52] U.S. Cl. .................................. 257/409; 257/394; 257/347; 257/368
[58] Field of Search ................. 351/237; 257/394, 397, 257/368, 409

[56] References Cited

U.S. PATENT DOCUMENTS

| 4,622,571 | 11/1986 | Hara | 357/42 |
| 4,825,278 | 4/1989 | Hillenius et al. | 357/53 |

FOREIGN PATENT DOCUMENTS

| 0225821 | 10/1986 | European Pat. Off. | 357/23.7 |
| 0361121 | 8/1989 | European Pat. Off. | 357/23.7 |
| 0370809 | 11/1989 | European Pat. Off. | 357/23.7 |
| 56-13771 | 2/1981 | Japan | 357/23.7 |
| 61-210672 | 9/1986 | Japan | 357/23.7 |
| 2309666 | 12/1990 | Japan | 257/394 |

OTHER PUBLICATIONS

"Reduction of Kink Effect in Thin-Film SOI MOSFET's", *IEEE Electron Device Letter*, by Jean-Pierre Colinge, vol. 9, No. 2, pp. 97-99, 1988.

*Primary Examiner*—Jerome Jackson
*Assistant Examiner*—Stephen D. Meier
*Attorney, Agent, or Firm*—Lowe, Price, LeBlanc & Becker

[57] ABSTRACT

A semiconductor device is an SOI type field effect transistor in which an active region is isolated and insulated by a transistor for isolation. A contact hole for isolation is formed in a gate dielectric thin film for isolation between a gate electrode of the transistor for isolation and a channel region below the gate electrode. In the semiconductor device thus structured, surplus carriers produced in a channel region below a transfer gate electrode are drawn through channel region and isolation contact hole into isolation gate electrode, thereby preventing such a disadvantageous phenomenon as a kink effect or the like due to a floating-substrate effect.

21 Claims, 7 Drawing Sheets

SEMICONDUCTOR DEVICE

This application is a continuation of application Ser. No. 07/767,333 filed Sep. 30, 1991.

BACKGROUND OF THE INVENTION

1. Field of the Invention

The present invention relates generally to semiconductor devices including MOS (Metal Oxide Semiconductor) field effect transistors (hereinafter referred to as "SOI (Silicon-On-Insulator)-MOSFET") formed in a semiconductor layer on an insulation layer and, more particularly, to a semiconductor device in which a degradation in breakdown voltage between sources/drains due to a so-called floating-substrate effect is prevented.

2. Description of the Background Art

Figure 1:
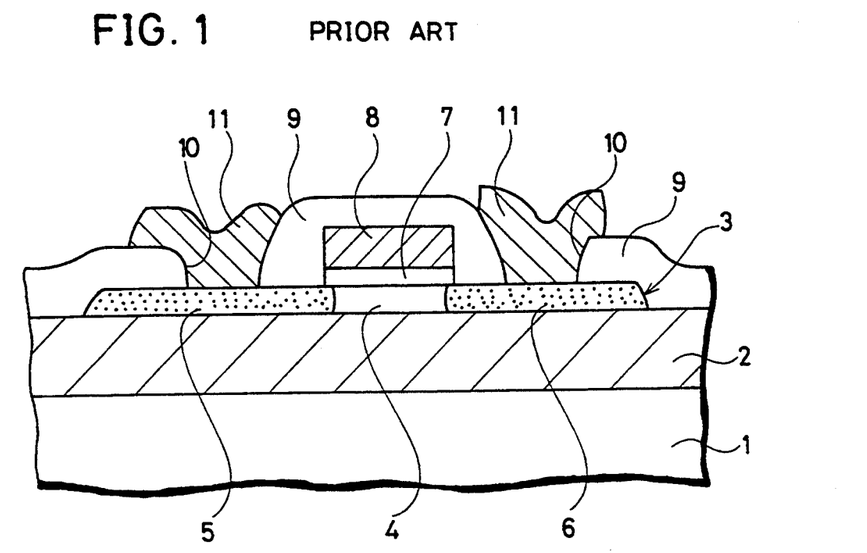
FIG. 1 is a cross-sectional view of a conventional SOI-MOSFET.
Figure 2:
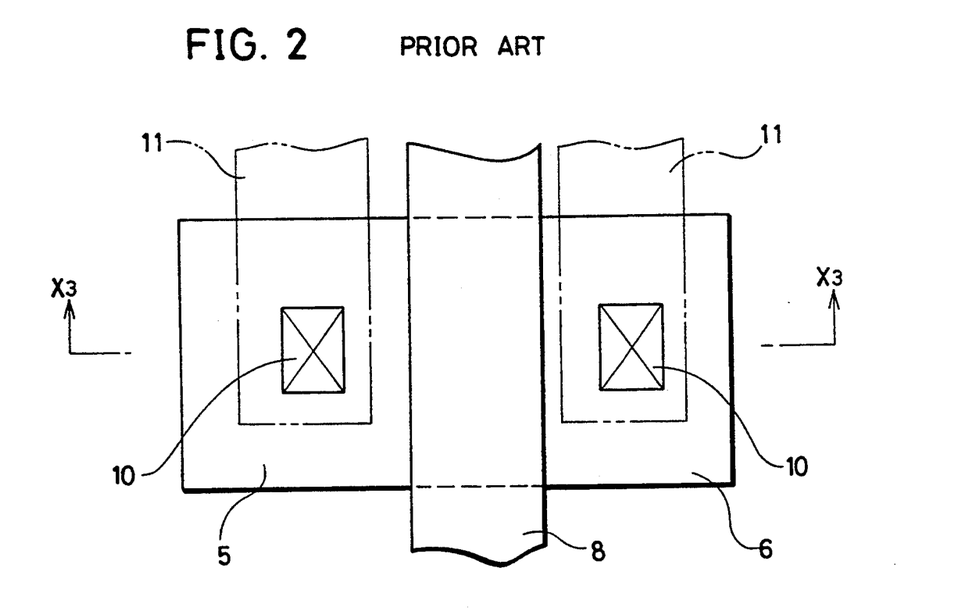
FIG. 2 is a plan view of the conventional SOI-MOSFET, and FIG. 1 corresponds to the cross-sectional view taken along the line $X_3$—$X_3$ of FIG. 2.

Description will now be made on a conventional SOI-MOSFET with reference to FIGS. 1 and 2. Referring to FIGS. 1 and 2, the conventional SOI-MOSFET includes an insulator layer 2 formed on a silicon substrate 1 and a silicon layer 3 formed on insulator layer 2. A channel region 4 having a lower concentration of p type impurities (e.g., $10^{16}$–$10^{17}$/cm$^3$) is formed in silicon layer 3. A source region 5 and a drain region 6 having a higher concentration of n type impurities (e.g., $10^{19}$–$10^{21}$/cm$^3$) are formed on opposite sides of channel region 4 in silicon layer 3.

A transfer gate electrode 8 is formed on channel region 4 with a gate dielectric thin film 7 interposed therebetween. Silicon layer 3 and transfer gate electrode 8 are covered with an interlayer insulation film 9. A contact hole 10 is made in interlayer insulation film 9. A conductive interconnection layer 11 is formed in contact hole 10.

In the SOI-MOSFET thus structured, when a positive voltage is applied to transfer gate electrode 8, n conductivity type carriers (electrons) are induced into an upper layer of p type channel region 4. The upper layer of channel region 4 is inverted to be of the same n conductivity type as that of source and drain regions 5 and 6. This enables a current to flow between source and drain regions 5 and 6. Further, since the concentration of the n type carriers induced into the upper layer of channel region 4 varies dependently on a gate voltage to be applied to transfer gate electrode 8, the amount of the current flowing in channel region 4 can be controlled by the gate voltage. This is an operation principle of the MOSFET.

When silicon layer 3 has a relatively large thickness such as of approximately 5000Å, if the SOI-MOSFET is rendered operative by application of a gate voltage, then carriers are accelerated at a high speed in channel region 4. The carriers accelerated in channel region 4 generate pairs of electrons and holes by impact ionization in the vicinity of drain region 6. The generated electrons flow into n+ drain region 6, while the generated holes are left and stored in channel region 4. This causes an increase in potential of channel region 4 and an increase in channel current, thereby causing an unpreferable so-called kink effect on curves indicating the relationship between a drain voltage and a drain current. The kink effect is described in, for example, *IEEE Electron Device Letter* Vol. 9, No. 2, pp. 97–99, 1988.

The kink effect will now be explained as follows by use of energy band diagrams shown in FIGS. 3A–3C. The channel region and the source/drain regions on the opposite sides of the channel region form npn junction.

Figure 3A:
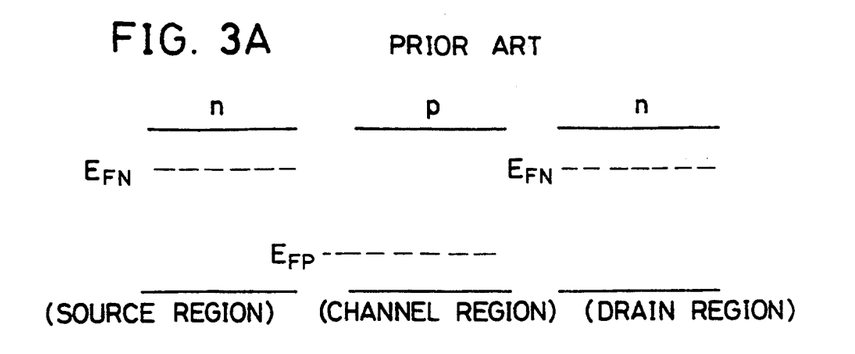
FIGS. 3A, 3B and 3C are diagrams for use in explaining a kink effect of the SOI-MOSFET by using an energy band diagram of npn junction of an SOI layer below a transfer gate electrode.
Figure 3B:
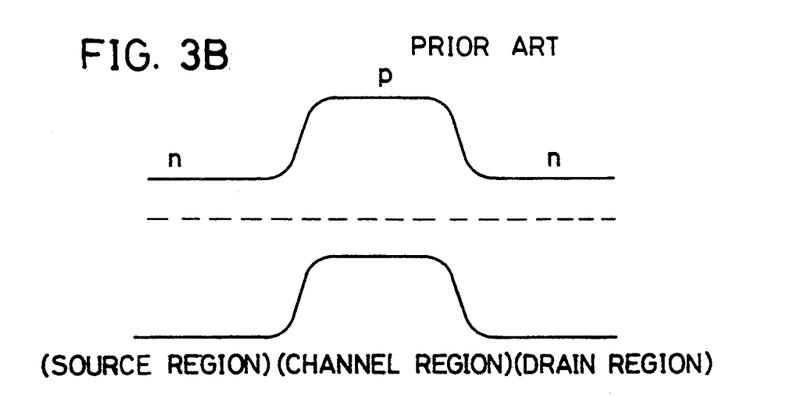
Figure 3C:
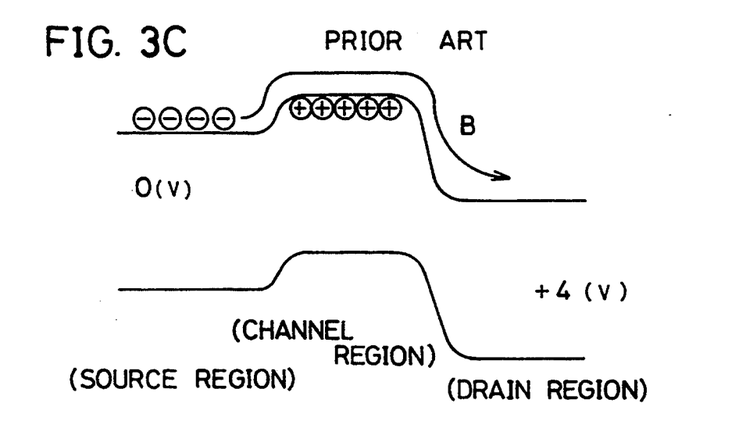

An energy band thereof is as shown in FIG. 3A prior to junction of the respective regions. More specifically, a Fermi level $E_{FN}$ of the n type source and drain regions is higher than a Fermi level $E_{FP}$ of the p type channel region. If the respective regions are connected together, the energy band thereof is balanced when the respective Fermi levels are equal, so that a potential of the n type source/drain regions becomes higher than that of the p type channel region as shown in FIG. 3B. In this state, when the source region is grounded and a potential of +4V is applied to the drain region, holes are stored in the upper layer of the channel region due to the kink effect, resulting in an increase in potential of the channel region. Accordingly, such an energy band as shown in FIG. 3C is provided. This facilitates the flow of electrons from the source region to the drain region in a direction indicated by the arrow B, thereby causing a degradation in breakdown voltage developed across the source/drain regions.

On the other hand, if silicon layer 3 has a very small thickness such as of approximately 500 to 1500Å, an SOI-MOSFET having such silicon layer 3 has the following excellent characteristics as compared with a normal SOI-MOSFET having relatively thick silicon layer 3 causing the above-described kink effect. For example, channel region 4 provided with thin silicon layer 3 is depleted overall by application of a voltage to transfer gate electrode 8, and a potential of channel region 4 is also controlled by the gate electrode. This results in reductions in a punch through phenomenon that a current flowing in channel region 4 cannot be controlled by transfer gate electrode 8 and in a short channel effect that a threshold voltage is abnormally decreased when the transfer gate electrode has a small length.

However, if the overall channel region 4 is completely depleted, then the potential in channel region 4 becomes higher than that provided in the normal MOSFET. Accordingly, an electric barrier provided between source region 5 and channel region 4 is decreased. In addition, if the holes produced by the above-described impact ionization are temporarily stored in channel region 4, then the potential in channel region 4 further rises, whereby electrons are abruptly injected into channel region 4 from source region 5. That is, there is such a disadvantage that the breakdown voltage developed across the source/drain regions is liable to decrease in a thin-film SOI-MOSFET.

Figure 4:
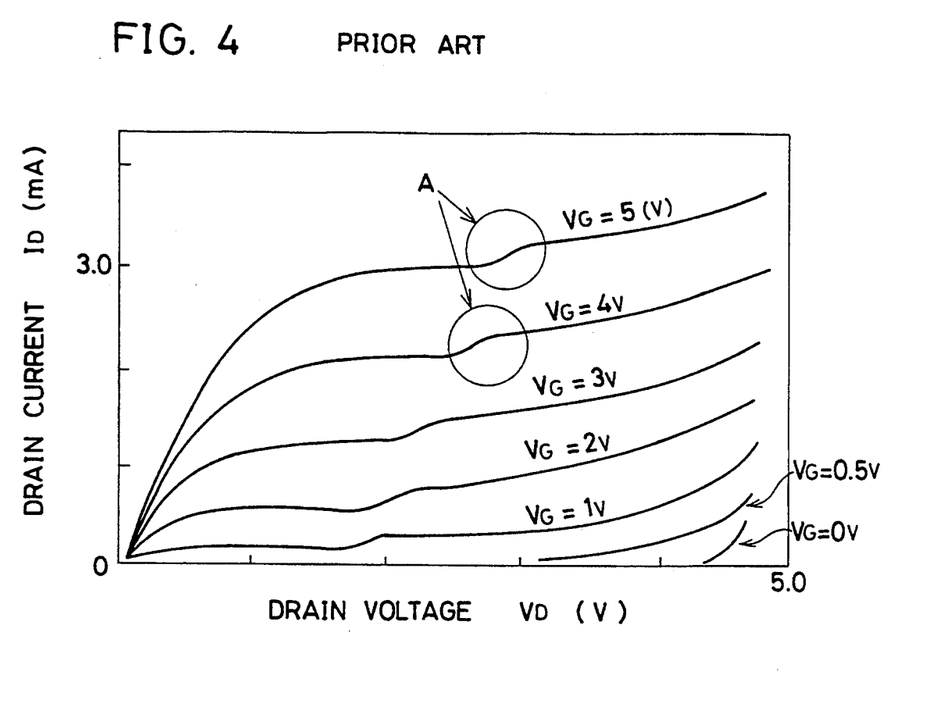
FIG. 4 is a diagram showing degradations in characteristics of a MOSFET due to the kink effect caused in the case with a relatively thick SOI layer, by using a graph of a $V_D$-$I_D$ characteristic.
Figure 5:
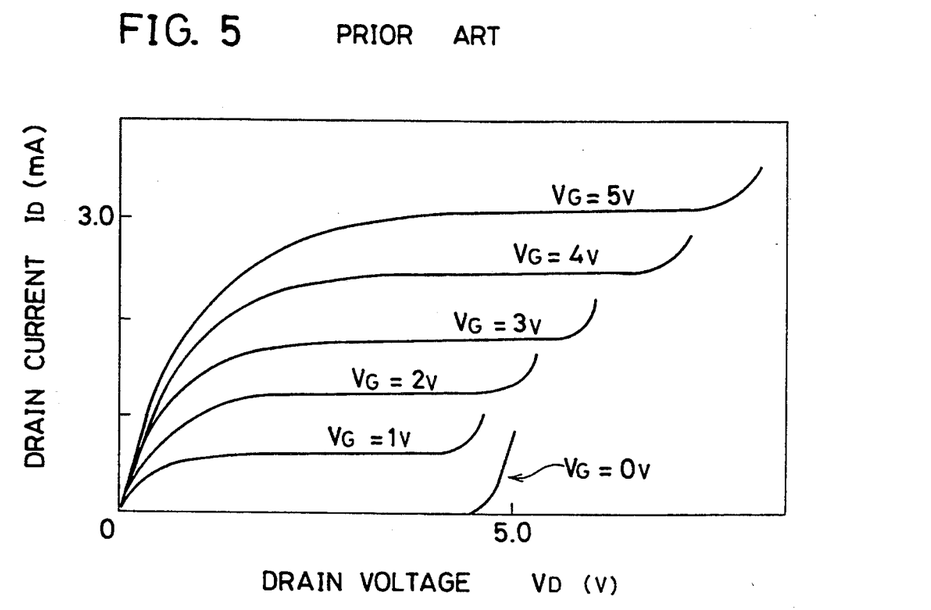
FIG. 5 is a diagram showing degradations in characteristics of the MOSFET due to a decrease in breakdown voltage developed across source/drain regions caused in the case with a relatively thin SOI layer, by using a graph of the $V_D$—$I_D$ characteristic.

A degradation in $V_D$-$I_D$ characteristic of the MOSFET having relatively thick silicon layer 3 due to the kink effect appears in the form of distortion in circles indicated by the arrow A in the graph of FIG. 4. Further, a degradation in breakdown voltage developed across the source/drain regions in the MOSFET having relatively thin silicon layer 3 appears in the form of such a phenomenon that a drain current $I_D$ abruptly increases if a drain voltage $V_D$ exceeds a predetermined value, as shown in the graph of FIG. 5.

SUMMARY OF THE INVENTION

An object of the present invention is to provide a semiconductor device that realizes inhibition of a kink effect caused when an SOI layer is relatively thick and a degradation in breakdown voltage developed between source/drain regions caused when the SOI layer is relatively thin by preventing storage of surplus carriers into a channel region and that has no degradation in transistor characteristics due to a floating-substrate effect.

A semiconductor device according to one aspect of the present invention includes a semiconductor layer formed on an insulation layer, a transfer gate electrode formed in an active region on the semiconductor layer with a gate dielectric thin film interposed therebetween, and a gate electrode for isolation formed in an isolation region on the semiconductor layer with a gate dielectric thin film for isolation interposed therebetween. A first conductivity type channel region is formed in the semiconductor layer below each of the transfer gate electrode and the isolation gate electrode. Second conductivity type source/drain regions are formed in the semiconductor layer on the opposite sides of the channel region under the transfer gate electrode. Further, a contact hole for isolation for electrically connecting the isolation gate electrode and the channel region below the isolation gate electrode is formed in the gate dielectric thin film for isolation.

In the foregoing structure, the channel region below the isolation gate electrode serves as a passage for surplus carriers such as generated holes. The surplus carriers that passed through the channel region are rapidly drawn out from a body contact. Thus, the surplus carriers are no longer stored in an upper layer of the channel region, thereby enabling suppression of a degradation in breakdown voltage developed across the source/drain regions due to a floating-substrate effect or occurrence of a kink effect.

A semiconductor device according to another aspect of the present invention includes a semiconductor layer formed on an insulation layer, a transfer gate electrode formed on the semiconductor layer with a gate dielectric thin film interposed therebetween, and a gate electrode for isolation formed on the semiconductor layer with a dielectric thin film for isolation interposed therebetween. A first conductivity type channel region is formed in the semiconductor layer below each of the transfer gate electrode and the isolation gate electrode. A first conductivity type body region is formed in the semiconductor layer below the isolation gate electrode and adjacent to the channel region below the isolation gate electrode. An interconnection layer for A body is formed on the body region with an insulator film interposed therebetween. The body region and the body interconnection layer are electrically connected with each other by a body contact formed in the insulator film therebetween.

In the foregoing structure, surplus carriers that passed through the channel region under the isolation gate electrode and introduced into the body region are drawn into the body interconnection layer through the body contact. Therefore, according to this aspect also, the surplus carriers are no longer stored in the channel region below the transfer gate electrode, thereby enabling prevention of a degradation in transistor characteristics due to a floating-substrate effect.

As has been described above, according to the present invention, in the SOI-MOSFET, the surplus carriers produced in the channel region between the transfer gate electrodes are not stored but drawn out by electrically connecting the isolation gate electrode and the channel region below the gate electrode or by connecting the body region provided in contact with the channel region below the isolation gate electrode to the body interconnection layer through the body contact. Accordingly, an increase in potential in the channel region is suppressed, and the occurrence of the kink effect due to the floating-substrate effect and the degradation in the breakdown voltage developed across the source/drain regions are prevented. This makes it possible to obtain an SOI-MOSFET having an excellent $V_D$-$I_D$ characteristic.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 6:
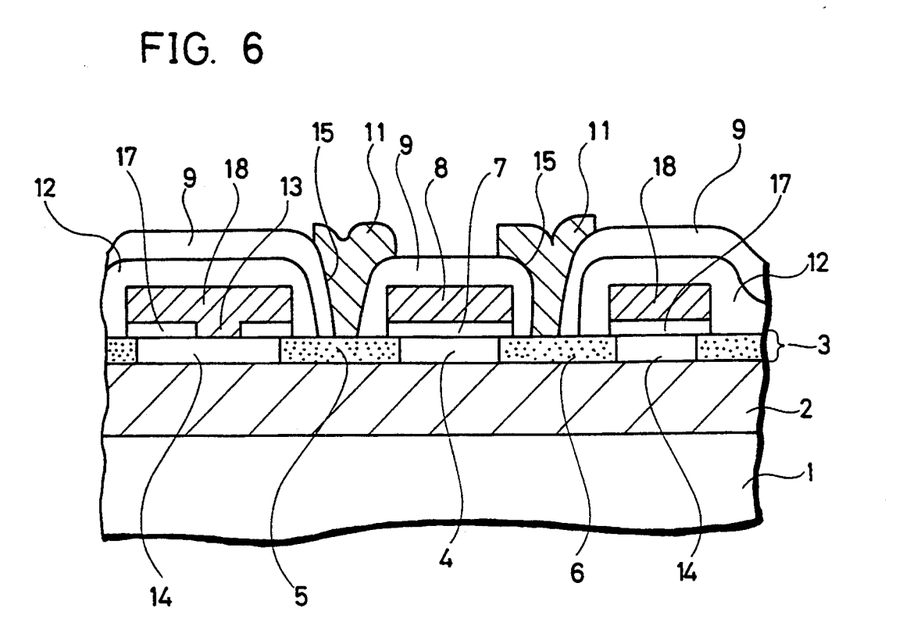
FIG. 6 is a cross-sectional view of an SOI-MOSFET according to a first embodiment of the present invention.
Figure 7:
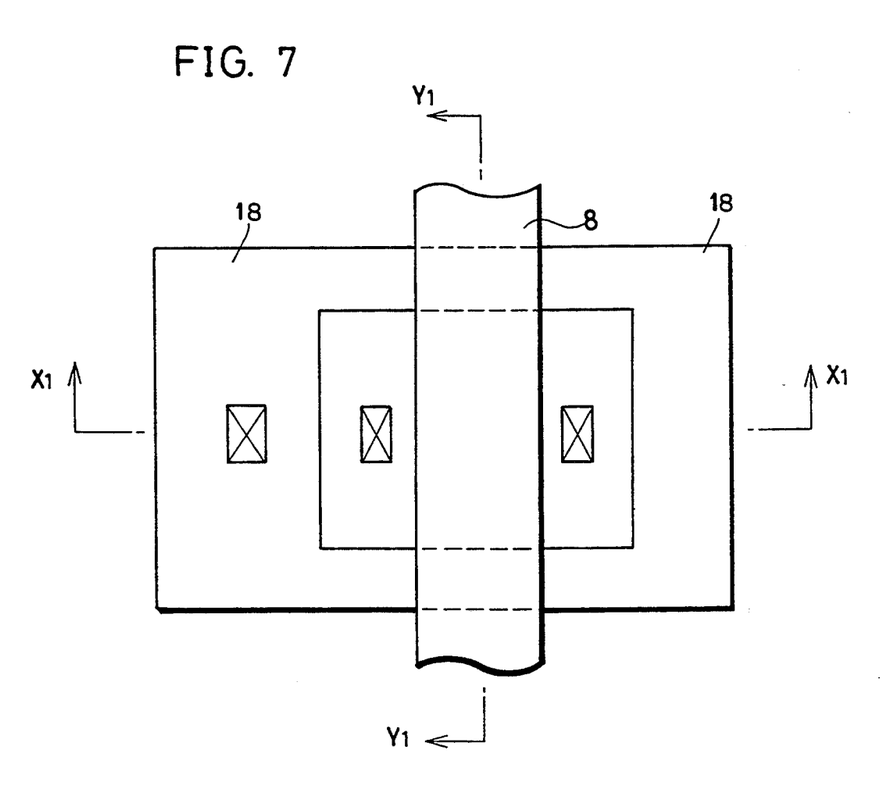
FIG. 7 is a plan view of the SOI-MOSFET according to the above embodiment, and FIG. 6 corresponds to the cross-sectional view taken along the line $X_1$—$X_1$ of FIG. 7.
Figure 8:
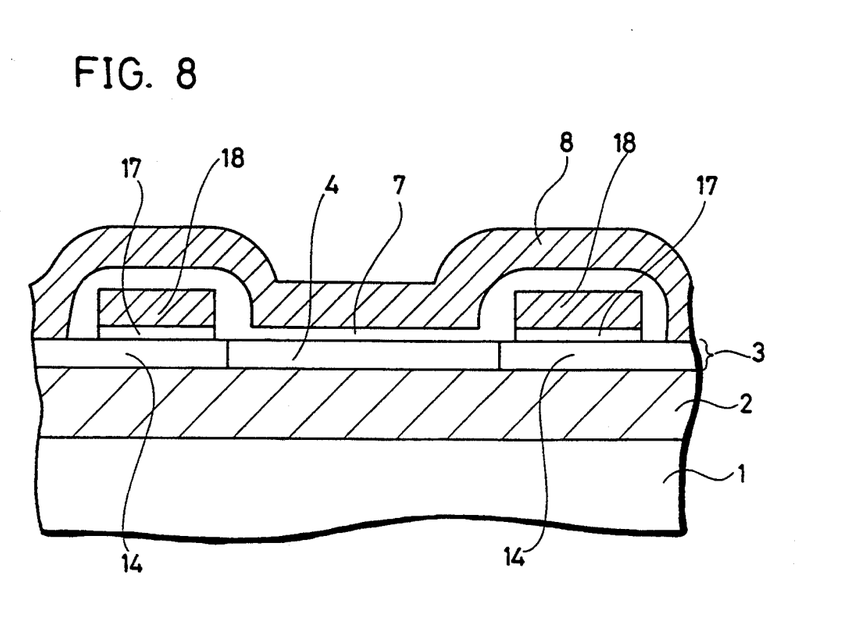
FIG. 8 is a cross-sectional view taken along the line $Y_1$—$Y_1$ of FIG. 7.

Description will now be made on a first embodiment of the present invention with reference to FIGS. 6–8. Referring to FIGS. 6–8, in an SOI-MOSFET according to this embodiment, an insulator layer 2 is formed on a silicon substrate 1, and a silicon layer 3 as a semiconductor layer is formed on insulator layer 2. The thickness of silicon layer 3 can be selected in the range of approximately 500Å to approximately 5000Å as required. A channel region 4 having a low p type impurity concentration (e.g., $10^{16}$—$10^{17}$/cm$^3$) is formed in silicon layer 3. A source region 5 and a drain region 6 both having a high n type impurity concentration (e.g., $10^{19}$–$10^{21}$/cm$^3$) are formed to interpose channel region 4 therebetween in silicon layer 3. A transfer gate electrode 8 is formed on channel region 4 with a gate dielectric thin film 7 interposed therebetween. Transfer gate electrode 8 is formed of polycrystalline silicon doped with impurities such as of phosphorus.

The above-described structure is the same as that of the conventional example; however, this embodiment is different from the conventional example in the following features. First, in the SOI-MOSFET according to this embodiment, isolation between transistors is made by employing a transistor for isolation. An isolation region in this embodiment is structured such that a gate electrode 18 for isolation is formed in the isolation region on silicon layer 3 with a gate dielectric thin film 17 for isolation interposed therebetween. A ground potential or a negative bias voltage is applied to isolation gate electrode 18 so as to prevent a surface of a channel region 14 formed in silicon layer 3 below gate electrode 18 from being inverted to be of an n type to cause the flow of a current, thereby retaining the insulation between SOI-MOSFETs in an active region. Further, an insulator film 12 for isolation is formed to cover gate electrode 18 in order to electrically insulate between an SOI-MOSFET for isolation that includes isolation gate electrode 18 as its principal constituent element and an SOI-MOSFET for driving that includes transfer gate electrode 8, source region 5 and drain region 6 as its principal constituent elements.

A contact hole 13 for isolation is formed to penetrate a portion of gate dielectric thin film 17 for isolation. Isolation gate electrode 18 is electrically connected to the channel region under gate electrode 18 through contact hole 13.

Source region 5, drain region 6, transfer gate electrode 8 and isolation gate electrode 18 are electrically connected to a conductive interconnection layer 11 in a contact hole 15 formed at a predetermined position in an interlayer insulation film 9 covering respective surfaces of those constituent elements 5, 6, 8 and 18. Conductive interconnection layer 11 is further connected to an external circuit.

Description will now be made on an operation of this embodiment. Surplus carriers generated by impact ionization in a high-electric field region at the boundary between channel region 4 and drain region 6 pass through channel region 4 below gate electrode 8 and then flow into channel region 14 below isolation gate electrode 18. In this embodiment, the surplus carriers are holes since n channel MOSFETs are implemented.

The surplus carriers that have flown into channel region 14 are further drawn into isolation gate electrode 18 from isolation contact hole 13 and then further introduced to the external circuit. Accordingly, the holes being the surplus carriers are no longer stored in channel region 4. This suppresses an increase in potential of channel region 4, resulting in a decrease in a so-called floating-substrate effect. Therefore, if an SOI film thickness of the SOI-MOSFET, i.e., the thickness of silicon layer 3 is relatively as large as approximately 5000Å, the kink effect that a distortion is produced in the $V_D$-$I_D$ characteristic is prevented. If the SOI film has a relatively small thickness of approximately 500–1500Å, such an effect is provided that a decrease in breakdown voltage developed across source/drain regions is suppressed. As described above, according to this embodiment, an excellent $V_D$-$I_D$ characteristic is obtained for both relatively thick silicon layer 3 and relatively thin silicon layer 3, thereby realizing substantial improvements in characteristic and reliability of the device.

While the n channel MOSFET has been described in this embodiment, it is needless to say that the same effect is provided in a p channel MOSFET in which the respective conductivity types of channel regions 4 and 14 and source and drain regions 5 and 6 are opposite to the respective conductivity types of those in the n channel MOSFET. In addition, while silicon layer 3 is used as a semiconductor layer in this embodiment, the same effect can be obtained when other semiconductor materials such as gallium arsenide (GaAs) are used for the semiconductor layer.

Figure 9:
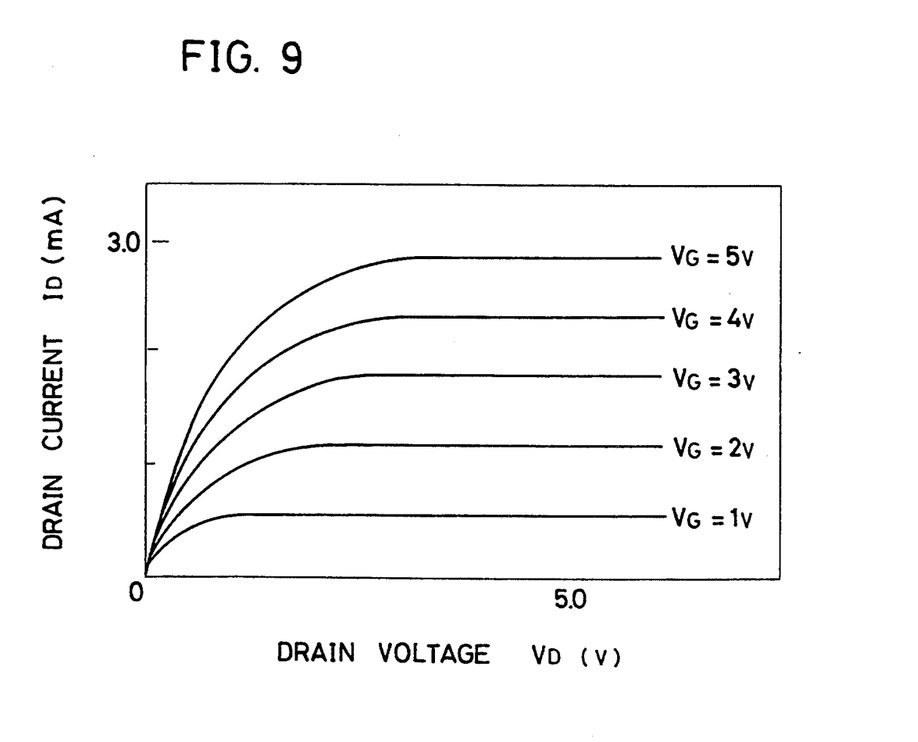
FIG. 9 is a diagram showing a graph of a $V_D$—$I_D$ characteristic of the SOI-MOSFET according to the above embodiment.
Figure 10:
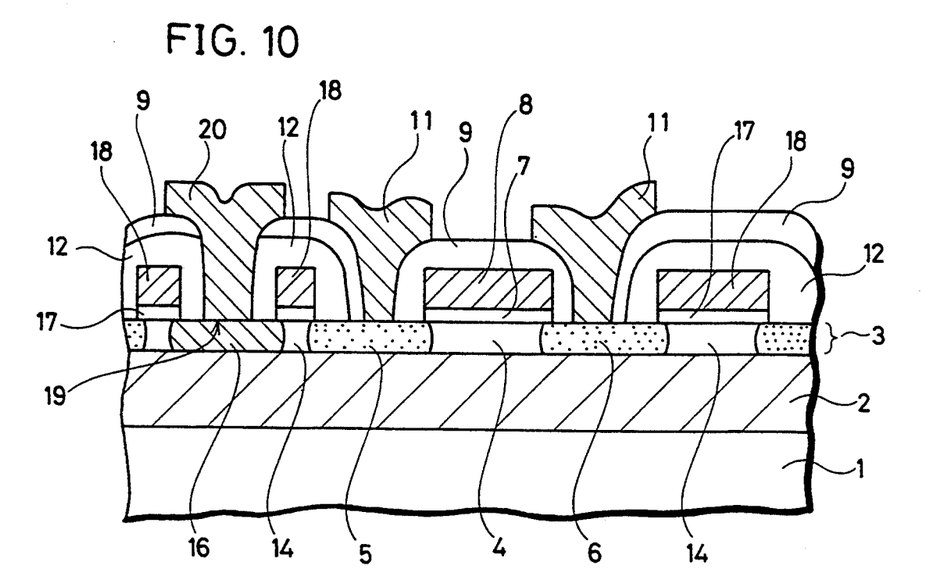
FIG. 10 is a cross-sectional view of an SOI-MOSFET according to a second embodiment of the present invention.
Figure 11:
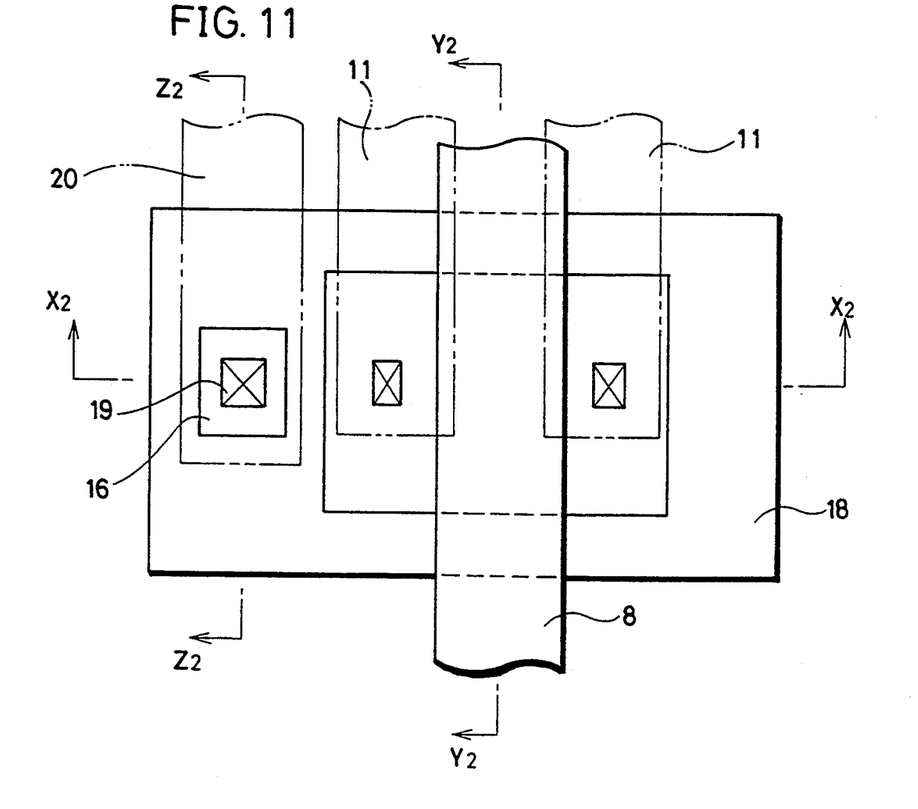
FIG. 11 is a plan view of the SOI-MOSFET according to the second embodiment, and FIG. 10 corresponds to the cross-sectional view taken along the line $X_2$—$X_2$ of FIG. 11.

FIG. 9 shows a graph of the $V_D$-$I_D$ characteristic of the SOI-MOSFET in this embodiment.

A second embodiment of the present invention will now be described with reference to FIGS. 10–13. Since the second embodiment is the same as the forgoing first embodiment except for the following points, like constituent elements are denoted with like reference numerals, and a description thereof will not be repeated here.

This embodiment differs from the first embodiment in that a body regions 16 with impurities of the same conductivity type as channel regions 4 and 14 at a concentration of approximately $10^{18}$–$10^{20}$/cm$^3$ is formed in silicon layer 3 in a predetermined region below isolation gate electrode 18 and that body region 16 is connected through a body contact 19 to an interconnection layer 20 for a body. This body region 16 serves to set or fix a lower part of channel region 4 in a predetermined potential such as a ground potential in order to achieve a stable transistor characteristic.

Description will now be made on an operation of the second embodiment. Surplus carriers (holes in this embodiment) produced by impact ionization in a high-electric field region at the boundary between channel region 4 and drain region 6 pass through channel region 4 below transfer gate electrode 8 and then flow into channel region 14 below isolation gate electrode 18. The surplus carriers that have passed through channel region 14 are introduced into body region 16, then introduced from body contact 19 to body interconnection layer 20 and drawn outside.

Like the foregoing first embodiment, since the SOI-MOSFET of this embodiment is thus operated, the holes as the surplus carriers are no longer stored in channel region 4 below transfer gate electrode 8, thereby suppressing an increase in potential, leading to a decrease in the floating-substrate effect. Thus, according to this embodiment also, suppression is made for such a kink effect as can be seen when silicon layer 3 of the SOI-MOSFET has a relatively large film thickness and for such a decrease in breakdown voltage developed across the source/drain regions as can be seen when the SOI film has a relatively small thickness. The excellent $V_D$-$I_D$ characteristic shown in the graph of FIG. 9 can be obtained.

Figure 12:
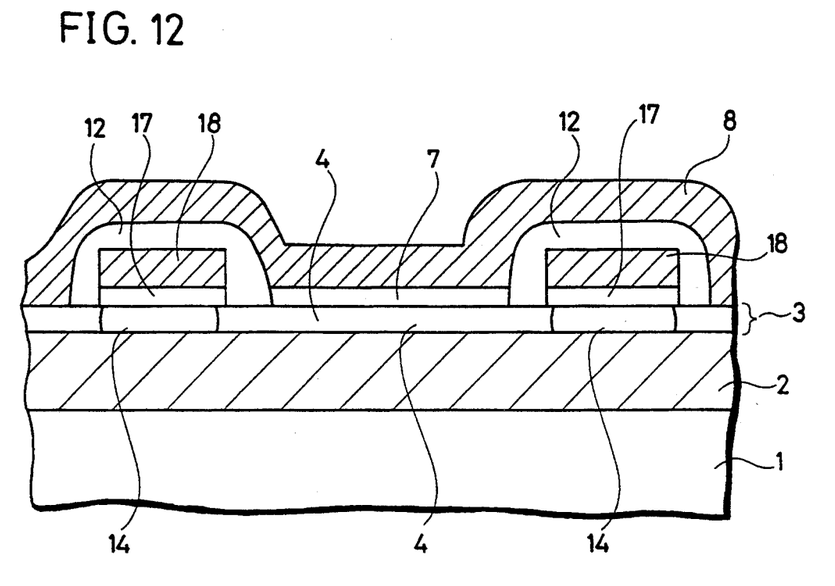
FIG. 12 is a cross-sectional view taken along the line $Y_2$—$Y_2$ of FIG. 11.
Figure 13:
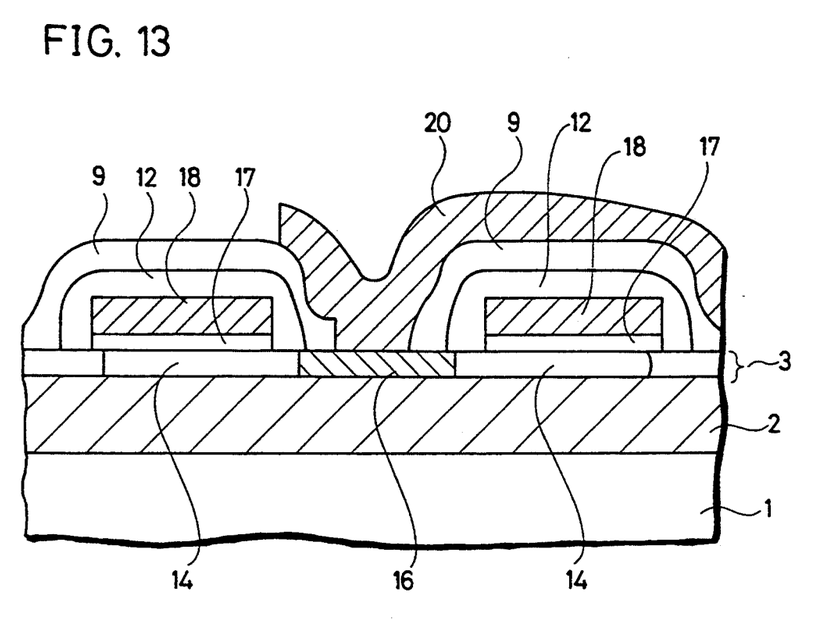
FIG. 13 is a cross-sectional view taken along the line $Z_2$—$Z_2$ of FIG. 11.

As related art to this embodiment, Japanese Patent laying-Open No. 62-109355 discloses an SOI-MOSFET that employs an element isolation method by a field insulation film and includes a region having the same conductivity type as that of a channel region and extending on the periphery of source/drain regions, and a body contact region for connecting these regions and an external interconnection layer. However, since the semiconductor device disclosed in the above laying-open does not employ a transistor for isolation, a region for electrically connecting the channel region and the body contact must separately be formed along the periphery of the source/drain regions. This causes a necessity to retain a larger area than a required area for an element isolation region, leading to a complication in manufacture process as well as a disadvantage in an increase of integration density. On the other hand, in this embodiment, the problems involved in the art disclosed in the laying-open are eliminated by positively utilizing the employment of the transistor for isolation. More specifically, channel region 14 below isolation gate electrode 18 is used as a region for electrically connecting body contact 16 and channel region 4. Channel region 14 is connected to channel region 4 in the cross-section taken along the line $Y_2-Y_2$ of FIG. 11 as shown in FIG. 12 It is thus unnecessary to newly form the region for electrically connecting body contact 19 and channel region 4 other than a field shield region for isolation between transistors. This results in no increase in area required for body contact, exerting no adverse influence on an increase in integration density. Further, the field shield region extends over the entire device having the SOI-MOSFET formed therein, and channel region 14 below the field shield region extends likewise continuously over the entire device. Accordingly, body region 16 and body contact 19 may be provided in at least one predetermined place in the continuous field shield region.

Like the first embodiment, in this embodiment also, it is needless to say that the same effect can be obtained in both the case with use of a p type channel MOSFET and the case with use of other semiconductors such as GaAs in place of silicon layer 3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor layer formed on an insulator layer;
   an isolation gate electrode formed in an isolation region surrounding an active region on said semiconductor layer with an insulating first gate dielectric thin film interposed therebetween;
   a transfer gate electrode formed in said active region on said semiconductor layer with a second gate dielectric thin film interposed therebetween and extending to cross over said isolation gate electrode;
   a first channel region of a first conductivity type formed in said semiconductor layer throughout the region under said transfer gate electrode;
   a second channel region of the first conductivity type formed in said semiconductor layer through the region under said isolation gate electrode;
   second conductivity type source/drain regions formed in said semiconductor layer at opposite portions thereof interposing said first channel region therebetween, wherein
   said first and second channel regions contact each other only at regions where said transfer gate electrode intersects said isolation gate electrode,
   a prescribed electric potential is applied to said isolation gate electrode so as to prevent the surface of said second channel region from being inverted to be of the second conductivity type, and
   said first gate dielectric thin film has a contact hole formed therein for electrically connecting said isolation gate electrode and said second channel region.

2. The semiconductor device according to claim 1, wherein
   a ground potential is applied to said first channel region so as to prevent the surface of said second channel region from being inverted to be of said second conductivity type.

3. The semiconductor device according to claim 1, wherein
   a predetermined bias voltage is applied to said first channel region so as to prevent the surface of said second channel region from being inverted to be of the second conductivity type.

4. The semiconductor device according to claim 1, wherein
   said first and second channel regions comprise a silicon layer doped with p type impurities;
   said transfer gate electrode and said isolation gate electrode are formed of polycrystalline silicon doped with n type impurities; and
   said source/drain regions are formed by doping n type impurities into said semiconductor layer.

5. The semiconductor device according to claim 4, wherein
   a ground potential is applied to said first channel region so as to prevent the surface of said second channel region from being inverted to be of an n conductivity type.

6. The semiconductor device according to claim 3, wherein
   a negative bias is applied to said first channel region so as to prevent the surface of said second region from being inverted to be of the n conductivity type.

7. The semiconductor device according to claim 4, wherein
   said first and second channel regions have a p type impurity concentration of $10^{16}$–$10^{17}$/cm$^3$; and
   said source/drain regions have an n type impurity concentration of $10^{19}$–$10^{21}$/cm$^3$.

8. The semiconductor device according to claim 1, wherein
   the same material as that of said isolation gate electrode is filled in said isolation contact hole.

9. A semiconductor device, comprising:
   a semiconductor layer formed on an insulator layer;
   a transfer gate electrode formed on said semiconductor layer with a gate dielectric thin film interposed therebetween;
   an isolation gate electrode formed on said semiconductor layer with a dielectric thin film for isolation interposed therebetween;
   a first channel region of a first conductivity type formed in said semiconductor layer below said transfer gate electrode;
   a second channel region of the first conductivity type formed in said semiconductor layer below said isolation gate electrode;
   second conductivity type source/drain regions formed in said semiconductor layer at opposite positions interposing said channel region below said transfer gate electrode therebetween; and
   a first conductivity type body region formed in said semiconductor layer below said isolation gate electrode and adjacent to said second channel region below said isolation gate electrode, wherein said body region has a body interconnection layer formed thereon, said body region and said body interconnection layer contact each other at a body contact disposed at the surface of said body region, and said body region and said body interconnection layer are isolated from said isolation gate electrode by an insulation layer interposed therebetween.

10. The semiconductor device according to claim 9, wherein a ground potential is applied through said body contact and said body interconnection layer to said body region.

11. The semiconductor device according to claim 9, wherein said semiconductor layer comprises a silicon layer doped with p type impurities;

said transfer gate electrode and said isolation gate electrode are formed of polycrystalline silicon doped with n type impurities;

said source/drain regions are formed by doping n type impurities into said semiconductor layer; and said body region is formed by further doping p type impurities into said semiconductor layer.

12. The semiconductor device according to claim 11, wherein a ground potential is applied through said body contact and said body interconnection layer to said body region.

13. The semiconductor device according to claim 11, wherein said semiconductor layer has a p type impurity concentration of $10^{16}$–$10^{17}$/cm$^3$;

said source/drain regions have an n type impurity concentration of $10^{19}$–$10^{21}$/cm$^3$; and said body region has a p type impurity concentration of $10^{18}$–$10^{20}$/cm$^3$.

14. The semiconductor device according to claim 9, wherein said first and second channel regions are electrically connected with each other.

15. A semiconductor device, comprising:

an insulator layer;

a semiconductor layer formed on said insulator layer, said semiconductor layer including a central active region circumscribed by an isolation region;

a first dielectric thin film formed circumscribing said central active region on an upper surface of said isolation region;

an isolation gate electrode formed circumscribing said active region on said first dielectric thin film;

an elongate second dielectric thin film formed on an upper surface of said central active region, opposite ends of said elongate second dielectric thin film extending onto upper surfaces of said isolation gate electrode at opposing sides of said isolation region;

an elongate transfer gate electrode formed on said elongate second dielectric thin film, opposite ends of said elongate transfer gate crossing over said upper surfaces of said isolating gate electrode at opposing sides of said isolation region;

a first channel region of a first conductivity type formed in said semiconductor layer throughout the region under said transfer gate electrode;

a second channel region of said first conductivity type formed in said semiconductor layer through the region under said isolation gate electrode;

source/drain regions of a second conductivity type formed in said semiconductor layer on opposite sides of said first channel region, wherein said first and second channel regions contact each other only at regions whereat said transfer gate electrode crosses over said isolation gate electrode, a predetermined potential is applied to said isolation gate electrode so as to prevent the surface of said second channel region from being inverted to be of the second conductivity type, and said first dielectric thin film for isolation has a contact hole formed therein through which said gate electrode is electrically connected to said second channel region.

16. The semiconductor device according to claim 15, further comprising a source of a ground potential applied to said first channel region so as to prevent a polarity inversion at the surface of said second channel region.

17. The semiconductor device according to claim 15, further comprising a source of a predetermined bias voltage applied to said first channel region so as to prevent the surface of second channel region from being inverted to be of the second conductivity type.

18. The semiconductor device according to claim 15, wherein said first and second channel regions each comprise a silicon layer doped with p type impurities;

said transfer gate electrode and said isolation gate electrode are formed of polycrystalline silicon doped with n type impurities; and said source/drain regions are formed by doping n type impurities into said semiconductor layer.

19. The semiconductor device according to claim 18, wherein a ground potential is applied to said first channel region so as to prevent the surface of said second channel region from being inverted to be of an n conductivity type.

20. The semiconductor device according to claim 18, wherein said first and second channel regions have a p type impurity concentration of $10^{16}$–$10^{17}$/cm$^3$; and said source/drain regions have an n type impurity concentration of $10^{19}10^{21}$/cm$^3$.

21. The semiconductor device according to claim 14, wherein said first and second channel regions contact with each other only at regions wherein said transfer gate electrode intersects said isolation gate electrode.

* * * * *

UNITED STATES PATENT AND TRADEMARK OFFICE
CERTIFICATE OF CORRECTION

PATENT NO. : 5,355,012
DATED : October 11, 1994
INVENTOR(S) : Yasuo YAMAGUCHI et al.

It is certified that error appears in the above-indentified patent and that said Letters Patent is hereby corrected as shown below:

Column 10, line 54, change "$10^{19}$ $10^{21}$" to --$10^{19} - 10^{21}$--.

Signed and Sealed this

Twenty-third Day of May, 1995

Attest:

BRUCE LEHMAN

*Attesting Officer*     *Commissioner of Patents and Trademarks*